(12) United States Patent
Murphy

(10) Patent No.: US 9,512,357 B2
(45) Date of Patent: Dec. 6, 2016

(54) RED-EMITTING PHOSPHORS, ASSOCIATED PROCESSES AND DEVICES

(71) Applicant: General Electric Company, Schenectady, NY (US)

(72) Inventor: James Edward Murphy, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 60 days.

(21) Appl. No.: 14/337,984

(22) Filed: Jul. 22, 2014

(65) Prior Publication Data
US 2016/0024378 A1    Jan. 28, 2016

(51) Int. Cl.
*C09K 11/61* (2006.01)
*C09K 11/02* (2006.01)
*H01L 33/50* (2010.01)

(52) U.S. Cl.
CPC ............ *C09K 11/617* (2013.01); *C09K 11/616* (2013.01); *F21K 9/64* (2016.08); *H01L 33/502* (2013.01)

(58) Field of Classification Search
None
See application file for complete search history.

(56) References Cited

U.S. PATENT DOCUMENTS

| | | | |
|---|---|---|---|
| 7,358,542 B2 | 4/2008 | Radkov et al. | |
| 7,497,973 B2 * | 3/2009 | Radkov | C09K 11/617 252/301.4 F |
| 7,648,649 B2 * | 1/2010 | Radkov | C09K 11/0838 252/301.4 H |
| 7,847,309 B2 * | 12/2010 | Radkov | C09K 11/675 252/301.4 R |
| 8,057,706 B1 * | 11/2011 | Setlur | C09K 11/02 252/301.4 F |
| 8,252,613 B1 * | 8/2012 | Lyons | C09K 11/617 438/45 |
| 8,491,816 B2 | 7/2013 | Hong et al. | |
| 8,710,487 B2 * | 4/2014 | Lyons | C09K 11/617 257/13 |
| 8,906,724 B2 * | 12/2014 | Murphy | H01L 33/502 438/34 |
| 2010/0142189 A1 * | 6/2010 | Hong | C09K 11/616 362/97.3 |
| 2012/0256125 A1 | 10/2012 | Kaneyoshi et al. | |
| 2013/0241396 A1 | 9/2013 | Hiramatsu et al. | |

FOREIGN PATENT DOCUMENTS

| | | | |
|---|---|---|---|
| CN | 102827601 A | 12/2012 | |
| CN | 102851026 A | 1/2013 | |
| GB | 1360690 A * | 7/1974 | ......... C09K 11/0833 |
| WO | 2009012301 A2 | 1/2009 | |
| WO | 2013121355 A1 | 8/2013 | |

OTHER PUBLICATIONS

Paulusz, "Efficient MN(IV) Emission in Fluorine Coordination", Jul. 1973, J. Electrochem. Soc., Solid-State Science and Technology, pp. 942-947.*
PCT Search Report and Written Opinion issued in connection with corresponding Application No. PCT/US2015/41102 on Oct. 8, 2015.
Liao et al.,"Synthesis of K2SiF6:Mn4+ Phosphor from SiO2 Powders via Redox Reaction in HF/KMnO4 Solution and Their Application in Warm-White LED", Journal of the American Ceramic Society, Wiley online library, Nov. 2013, vol. 96, Issue 11, pp. 3552-3556.
Hu et al., "Preparation and luminescent properties of (Ca1-x,Srx)S:Eu2+ red-emitting phosphor for white LED", Journal of Luminescence, ScienceDirect, Feb. 1, 2005,vol. 111, Issue 3, pp. 139-145.
Kasa et al.,"Red and Deep Red Emissions from Cubic K2SiF6:Mn4+ and Hexagonal K2MnF6 Synthesized in HF/KMnO4/KHF2/Si Solutions", Journal of the Electrochemical Society, ECS, 2012, vol. 159, issue 4, pp. J89-J95.

* cited by examiner

*Primary Examiner* — Matthew E. Hoban
*Assistant Examiner* — Lynne Edmondson
(74) *Attorney, Agent, or Firm* — Mary Louise Stanford

(57) ABSTRACT

A process for synthesizing a $Mn^{4+}$ doped phosphor is presented. The process includes contacting a source of $Mn^{4+}$ ions to a suspension comprising aqueous hydrofluoric acid and a complex fluoride compound of formula (II) in solid form, and then contacting a source of $A^+$ ions to the suspension to form the $Mn^{4+}$ doped phosphor, $$A_x[MF_y] \qquad (II)$$

Wherein,
A is Li, Na, K, Rb, Cs, or a combination thereof;
M is Si, Ge, Sn, Ti, Zr, Al, Ga, In, Sc, Hf, Y, La, Nb, Ta, Bi, Gd, or a combination thereof;
x is the absolute value of the charge of the $[MF_y]$ ion;
y is 5, 6 or 7.

7 Claims, 3 Drawing Sheets

RED-EMITTING PHOSPHORS, ASSOCIATED PROCESSES AND DEVICES

BACKGROUND

Red-emitting phosphors based on complex fluoride materials activated by $Mn^{4+}$, such as those described in U.S. Pat. No. 7,358,542, U.S. Pat. No. 7,497,973, and U.S. Pat. No. 7,648,649, can be utilized in combination with yellow/green emitting phosphors such as YAG:Ce or other garnet compositions to achieve warm white light (CCTs<5000 K on the blackbody locus, color rendering index (CRI)>80) from a blue LED, equivalent to that produced by current fluorescent, incandescent and halogen lamps. These materials absorb blue light strongly and efficiently emit between about 610-635 nm with little deep red/NIR emission. Therefore, luminous efficacy is maximized compared to red phosphors that have significant emission in the deeper red where eye sensitivity is poor. Quantum efficiency can exceed 85% under blue (440-460 nm) excitation.

Processes for synthesizing the phosphors are known, for example as described in US20120256125, WO2007/100824, US 20100142189 and EP2508586. However, alternative processes that can provide advantages over existing processes, such as improved phosphor properties or lower cost for manufacturing, are desirable.

BRIEF DESCRIPTION

Briefly, in one aspect, the present invention relates to a process for synthesizing a $Mn^{4+}$ doped phosphor. The process includes contacting a source of $Mn^{4+}$ ions to a suspension comprising aqueous hydrofluoric acid and a complex fluoride compound of formula (II), and then contacting a source of $A^+$ ions to the suspension to form the $Mn^{4+}$ doped phosphor, $$A_x[MF_y] \qquad (II)$$

wherein

A is Li, Na, K, Rb, Cs, or a combination thereof;

M is Si, Ge, Sn, Ti, Zr, Al, Ga, In, Sc, Hf, Y, La, Nb, Ta, Bi, Gd, or a combination thereof;

x is the absolute value of the charge of the $[MF_y]$ ion;

y is 5, 6 or 7.

In another aspect, the present invention relates to the $Mn^{4+}$ doped phosphors that may be produced by the process, and lighting apparatuses and backlight devices that include the $Mn^{4+}$ doped phosphors.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
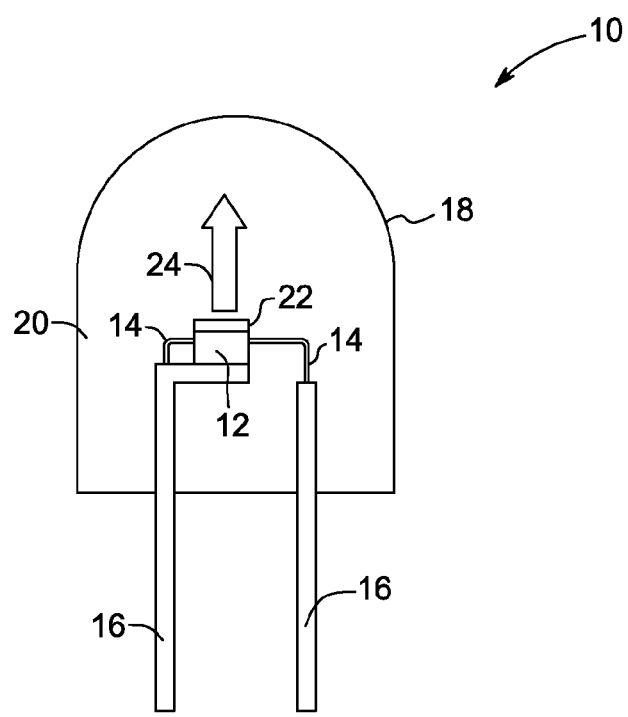
FIG. 1 is a schematic cross-sectional view of a lighting apparatus in accordance with one embodiment of the invention.

Approximate language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value. In the following specification and claims, the singular forms "a", "an" and "the" include plural referents, unless the context clearly dictates otherwise.

In the context of the present invention, the term "complex fluoride" or "complex fluoride material", means a coordination compound, containing at least one coordination center, surrounded by fluoride ions acting as ligands, and charge-compensated by counter ions as necessary. In one example, $K_2SiF_6$, the coordination center is Si and the counter ion is K. Complex fluorides are occasionally written down as a combination of simple, binary fluorides but such a representation does not indicate the coordination number for the ligands around the coordination center. The square brackets (occasionally omitted for simplicity) indicate that the complex ion they encompass is a new chemical species, different from the simple fluoride ion. In particular embodiments, the coordination center of the complex fluorides that is, M in formula (II) is Si, Ge, Sn, Ti, Zr, or a combination thereof. More particularly, the coordination center is Si, Ge, Ti, or a combination thereof.

Examples of the complex fluoride compounds of formula (II) include $K_2[SiF_6]$, $K_2[TiF_6]$, $K_2[SnF_6]$, $Cs_2[TiF_6]$, $Rb_2[TiF_6]$, $Cs_2[SiF_6]$, $Rb_2[SiF_6]$, $Na_2[TiF_6]$, $Na_2[ZrF_6]$, $K_3[ZrF_7]$, $K_3[BiF_6]$, $K_3[YF_6]$, $K_3[LaF_6]$, $K_3[GdF_6]$, $K_3[NbF_7]$, $K_3[TaF_7]$. In particular embodiments, the phosphor of formula (II) is $K_2SiF_6$.

In the $Mn^{4+}$-doped phosphors, for example $Mn^{4+}$-doped complex fluoride materials such as $K_2SiF_6:Mn^{4+}$, the activator ion ($Mn^{4+}$) also acts as a coordination center, substituting part of the centers of the host lattice, for example, Si. The host lattice (including the counter ions) may further modify the excitation and emission properties of the activator ion. The coordination center of the complex fluoride composition is manganese (Mn). The counter ion, or A in formula I and formula (II) is Na, K, Rb, Cs, or a combination thereof, and y is 6.

Examples of $Mn^{4+}$ doped phosphors of formula I include $K_2[SiF_6]:Mn^{4+}$, $K_2[TiF_6]:Mn^{4+}$, $K_2[SnF_6]:Mn^{4+}$, $Cs_2[TiF_6]:Mn^{4+}$, $Rb_2[TiF_6]:Mn^{4+}$, $Cs_2[SiF_6]:Mn^{4+}$, $Rb_2[SiF_6]:Mn^{4+}$, $Na_2[TiF_6]:Mn^{4+}$, $Na_2[ZrF_6]:Mn^{4+}$, $K_3[ZrF_7]:Mn^{4+}$, $K_3[BiF_6]:Mn^{4+}$, $K_3[YF_6]:Mn^{4+}$, $K_3[LaF_6]:Mn^{4+}$, $K_3[GdF_6]:Mn^{4+}$, $K_3[NbF_7]:Mn^{4+}$, $K_3[TaF_7]:Mn^{4+}$. In particular embodiments, the phosphor of formula I is $K_2SiF_6:Mn^{4+}$.

For the synthesis of the $Mn^{4+}$ doped phosphor, according to embodiments of the invention, a source of $Mn^{4+}$ ions is contacted to a suspension having aqueous hydrofluoric acid and a complex fluoride compound of formula (II). In some embodiments, the suspension may be prepared by adding the compound in solid form (i.e., powder form) to aqueous hydrofluoric acid at a temperature greater than about 60° C., and then cooling the suspension to a temperature less than about 30° C. In other embodiments, the suspension may be formed by precipitating the compound of formula (II) from a solution. Methods for precipitating are not particularly limited, and many known methods may be used, including, but not limited to, polythermal precipitation processes, evaporation of solvent from a concentrated solution, addition of a poor solvent, and precipitation by the common ion effect. In a polythermal process, temperature of a concentrated solution is adjusted to cause precipitation; process parameters such as the rate of cooling may be adjusted to change final particle size. In precipitation by the common ion effect, the compound of formula II may be precipitated by combining at least two of a source of $A^+$ ions, source of ions of formula $MF_y^{-2}$, and the compound of formula II under conditions suitable for precipitation, in particular, by combining a source of $A^+$ ions or a source of ions of formula $MF_y^{-2}$ or both a source of $A^+$ ions and a source of ions of formula $MF_y^{-2}$, with a concentrated solution of the compound of formula II.

The complex fluoride compound is present in the suspension in solid form, particularly in particulate form. In some embodiments, it is desirable to use particles of small particle size, for example a D50 particle size of less than about 50 microns. In particular embodiments, the D50 particle size of the particles ranges from about 5 microns to about 40 microns, and more particularly from about 10 microns to about 30 microns. In some embodiments, the population of particles of the compound is milled to achieve reduced particle size. The particle size distribution may be relatively narrow.

In some embodiments, the source of $Mn^{4+}$ ions is provided in form of a solution. A solution may be prepared by dissolving (mixing) a manganese-containing compound in aqueous hydrofluoric acid (HF). A suitable manganese-containing compound is a compound that directly provides $Mn^{4+}$ ions or can be converted to another compound to provide $Mn^{4+}$ ions. In one embodiment, the manganese-containing compound does not contain any metal atom other than manganese. Examples of suitable sources of $Mn^{4+}$ ions include a compound of formula (III): $A_x[MnF_y]$, manganese acetate, manganese carbonate, manganese nitrate, $MnF_2$, $MnF_3$, $MnCl_3$, $MnCl_2$ hydrate, $MnO_2$, $K_2MnF_5.H_2O$, $KMnO_4$ and combinations thereof. In particular embodiments, the source of $Mn^{4+}$ ions is $K_2MnF_6$.

A source of $A^+$ ions may be combined with the suspension in a solution of aqueous hydrofluoric acid. The source of $A^+$ ions may be a salt, wherein the corresponding anion for $A^+$ is fluoride, chloride, acetate, chloride, oxalate, dihydrogen phosphate, or a combination thereof, particularly fluoride. Examples of suitable materials include KF, $KHF_2$, LiF, $LiHF_2$, NaF, $NaHF_2$, RbF, $RbHF_2$, CsF, $CsHF_2$, and combinations thereof. In particular embodiments, the anion is fluoride, and A includes K.

Concentration of the hydrofluoric acid in the aqueous solutions used in the processes of the present invention typically ranges from about 20% w/w to about 70% w/w, particularly from about 40% w/w to about 55% w/w. Other acids may be included in the solvents if desired, such as hexafluorosilicic acid ($H_2SiF_6$).

The processes as described above may result in a population of particles having a Me doped phosphor. In one embodiment, the $Mn^{4+}$ doped phosphor has formula (I).

$$A_x[MF_y]:Mn^{4+} \tag{I}$$

In one embodiment, the particles have a core-shell structure. As used herein, the core-shell structure means that the particles have an interior core having chemically different composition from the exterior surface or shell. In one embodiment, the particles are composed of a core comprising a compound of formula (II) and a first shell comprising a compound of formula (IV) disposed on the core.

$$A_x[(M_{1-z}Mn_z)F_y] \tag{IV}$$

wherein, $0<z\leq0.2$.

In some embodiments, the surface of the core particles may be substantially covered with the first shell. In the context of the present invention, 'substantially' means that at least about 80 percent, or particularly at least about 70 percent of the surface of the particles are covered with the first shell. In some embodiments, the interior core is substantially free of $Mn^{4+}$ ions. In some embodiments, $Mn^{4+}$ ions may diffuse from the first shell to the core. In some embodiments, $0<z\leq0.1$, and more particularly, $0<z\leq0.06$.

The addition of the source of $Mn^{4+}$ ions, the source of $A^+$ ions or both to the suspension containing the complex fluoride compound is carried out at a temperature, for a duration of time and at a rate of addition that avoid the nucleation of new particles of a compound and produce the population of covered particles (core-shell structure particles). In some embodiments, the temperature at which the source of $Mn^{4+}$ ions, the source of $A^+$ ions or both are added to the suspension ranges from about 20° C. to about 70° C. However, the rates of addition, addition times, addition order, temperatures and reactant concentrations may be tuned to optimize the performance of the resulting $Mn^{4+}$ doped phosphor for a particular application.

In some embodiments, a source of tetravalent element M is further added to the suspension during or after the addition of the source of $Mn^{4+}$ ions and the source of $A^+$ ions. In one embodiment, the source of tetravalent element M is soluble in hydrofluoric acid. Examples of suitable sources of tetravalent element Si include $H_2SiF_6$, $A_2SiF_6$, $SiO_2$, $SiCl_4$, $Si(OAc)_4$ and silicon tetralkoxides, such as tetraethyl orthosilicate ($Si(OEt)_4$). Particular examples are $K_2SiF_6$ and $H_2SiF_6$. Examples of suitable sources of tetravalent element Ge include $GeCl_4$, $Ge(OEt)_4$, $Ge(OPr)_4$, $Ge(OMn^{4+})_4$, $GeO_2$ and combinations thereof.

The source of tetravalent element M may be provided in the solvent used in the suspension, for example, in aqueous hydrofluoric acid. The source of tetravalent element M may be combined with or followed by the addition of the source of $A^+$ ions. That is, the source of $A^+$ ions may further be added during or after the addition of the source of the tetravalent element M to the suspension. In particular embodiments, a solution of $K_2SiF_6$ as the source of M with aqueous hydrofluoric acid is added to the suspension. In some embodiments, a solution including aqueous hydrofluorosilicic acid ($H_2SiF_6$) is added.

Addition of the source of tetravalent element M provides a second shell disposed on the first shell of the population of phosphor particles. In some embodiments, the phosphor particles are composed of a core, a first shell covering the core, and a second shell covering the first shell. In particular embodiments, second shell may be composed of a composition of formula (V), $$A_x[(M_{1-w}Mn_w)F_y] \tag{V}$$

wherein $0\leq w\leq z$.

In some embodiments, the surface of the first shell of the particles may be substantially covered with the second shell. In the context of the present invention, 'substantially' means that at least about 80 percent, or particularly at least about 70 percent of the surface of the first shell of the particles is covered with the second shell. In some embodiments, $Mn^{4+}$ ions may diffuse from the first shell to the core and the second shell. In some embodiments, $0<w\leq0.1$, and more particularly, $0<w\leq0.05$. If desired, the core-shell phosphor may be treated as described in U.S. Pat. No. 8,252,613. Alternatively, the core-shell phosphor may be treated with a solution comprising $H_2MF_y$, including a solution of $H_2MF_y$, mixtures of HF and $H_2MF_y$, and mixtures of HF, and $H_2MF_y$ and a compound of formula II. In some cases, the treatment may improve properties of the core-shell phosphor, such as color stability.

After completion of the synthesis process steps, the resulting phosphor may be separated from the liquid phase. The precipitate can be vacuum filtered, rinsed with a solution such as acetic acid, aqueous hydrofluoric acid and/or acetone, or a mixture thereof, and then dried to receive the $Mn^{4+}$ doped phosphor. In one embodiment, the resulting phosphor has a population of particles having a core of formula (II) and a first shell of formula (IV) covering the core. In one embodiment, the resulting phosphor has a population of particles having a core of formula (II) and a first shell of formula (IV) covering the core, and a second shell of formula (V) covering the first shell.

In some embodiments, A is K, and M is Si. More particularly, the complex fluoride compound is $K_2[MF_6]$, the source of $Mn^{4+}$ ions is $K_2[MnF_6]$ and the source of tetravalent element M is hydrofluorosilicic acid. In some embodiments, the compound of formula (IV) is $K_2[(Si_{1-z}, Mn_z)F_6]$ and the compound of formula (V) is $K_2[(Si_{1-w}, Mn_w)F_6]$. The $Mn^{+4}$ doped resulting phosphor is $K_2SiF_6:Mn^{4+}$.

In another aspect of the present invention, a process includes contacting a source of $Mn^{4+}$ ions to a suspension having aqueous hydrofluoric acid and a complex fluoride compound in solid form, and contacting a source of $A^+$ ions to the suspension to form a $Mn^{4+}$ doped phosphor. The complex fluoride compound is selected from the group consisting of
  (A) $A_2[MF_5]$, where A is selected from Li, Na, K, Rb, Cs, and combinations thereof; and where M is selected from Al, Ga, In, and combinations thereof;
  (B) $A_3[MF_6]$, where A is selected from Li, Na, K, Rb, Cs, and combinations thereof; and where M is selected from Al, Ga, In, and combinations thereof;
  (C) $Zn_2[MF_7]$, where M is selected from Al, Ga, In, and combinations thereof;
  (D) $A[In_2F_7]$, where A is selected from Li, Na, K, Rb, Cs, and combinations thereof;
  (E) $A_2[MF_6]$, where A is selected from Li, Na, K, Rb, Cs, and combinations thereof; and where M is selected from Ge, Si, Sn, Ti, Zr, and combinations thereof;
  (F) $E[MF_6]$, where E is selected from Mg, Ca, Sr, Ba, Zn, and combinations thereof; and where M is selected from Ge, Si, Sn, Ti, Zr, and combinations thereof;
  (G) $Ba_{0.65}Zr_{0.35}F_{2.70}$; and
  (H) $A_3[ZrF_7]$, where A is selected from Li, Na, K, Rb, Cs, and combinations thereof.
The process steps and several compounds are as described above.

After completion of the described synthesis process steps, the $Mn^{4+}$ doped phosphor may undergo a treatment process as described in U.S. Pat. No. 8,252,613. In one embodiment, the synthesized $Mn^{4+}$ doped phosphor is contacted with a fluorine-containing oxidizing agent in gaseous form at an elevated temperature. The temperature at which the phosphor is contacted with the fluorine-containing oxidizing agent is any temperature in the range from about 200° C. to about 900° C., particularly from about 350° C. to about 600° C., and in some embodiments, from about 400° C. to about 575° C. In various embodiments of the present invention, the temperature is at least 100° C., particularly at least 225° C., and more particularly at least 350° C. The phosphor is contacted with the oxidizing agent for a period of time sufficient to increase its performance and stability of the resulting phosphor. Time and temperature are interrelated, and may be adjusted together, for example, increasing time while reducing temperature, or increasing temperature while reducing time. In particular embodiments, the time is at least one hour, particularly for at least four hours, more particularly at least six hours, and most particularly at least eight hours.

Reducing the temperature at a controlled rate of ≤5° C. per minute may yield a phosphor product having superior properties compared to reducing the temperature at a rate of 10° C./minute. In various embodiments, the rate may be controlled at ≤5° C. per minute, particularly at ≤3° C. per minute, more particularly at a rate of ≤1° C. per minute.

The period of time over which the temperature is reduced at the controlled rate is related to the contact temperature and cooling rate. For example, when the contact temperature is 540° C. and the cooling rate is 10° C./minute, the time period for controlling the cooling rate may be less than one hour, after which the temperature may be allowed to fall to the purge or ambient temperature without external control. When the contact temperature is 540° C. and the cooling rate is ≤5° C. per minute, then the cooling time may be less than two hours. When the contact temperature is 540° C. and the cooling rate is ≤3° C. per minute, then the cooling time may be less than three hours. When the contact temperature is 540° C. and the cooling rate is ≤1° C. per minute, then the cooling time is may be less than four hours. For example, the temperature may be reduced to about 200° C. with controlled cooling, then control may be discontinued. After the controlled cooling period, the temperature may fall at a higher or lower rate than the initial controlled rate.

The fluorine-containing oxidizing agent may be $F_2$, HF, $SF_6$, $BrF_5$, $NH_4HF_2$, $NH_4F$, KF, $AlF_3$, $SbF_5$, $ClF_3$, $BrF_3$, KrF, $XeF_2$, $XeF_4$, $NF_3$, $SiF_4$, $PbF_2$, $ZnF_2$, $SnF_2$, $CdF_2$ or a combination thereof. In particular embodiments, the fluorine-containing oxidizing agent is $F_2$. The amount of oxidizing agent in the atmosphere may be varied to obtain the desirable properties of the phosphor, particularly in conjunction with variation of time and temperature. Where the fluorine-containing oxidizing agent is $F_2$, the atmosphere may include at least 0.5% $F_2$, although a lower concentration may be effective in some embodiments. In particular the atmosphere may include at least 5% $F_2$ and more particularly at least 20% $F_2$. The atmosphere may additionally include nitrogen, helium, neon, argon, krypton, xenon, in any combination with the fluorine-containing oxidizing agent. In a particular embodiment, the atmosphere is composed of about 20% $F_2$ and about 80% nitrogen.

The manner of contacting the phosphor with the fluorine-containing oxidizing agent is not critical and may be accomplished in any way sufficient to achieve the desired properties. In some embodiments, a chamber containing the phosphor may be dosed and then sealed such that an overpressure develops as the chamber is heated, and in others, the fluorine and nitrogen mixture is flowed throughout the anneal process ensuring a more uniform pressure. In some embodiments, an additional dose of the fluorine-containing oxidizing agent may be introduced after a period of time.

In one embodiment, the $Mn^{4+}$ doped phosphor is further treated with a saturated solution of a composition of formula (II) in aqueous hydrofluoric acid after contacting the phosphor with the fluorine-containing oxidizing agent. The temperature at which the phosphor is contacted with the solution ranges from about 20° C. to about 50° C. The period of time required to treat the phosphor ranges from about one minute to about five hours, particularly from about five minutes to about one hour. Concentration of hydrofluoric acid in the aqueous HF solutions ranges from about 20% w/w to about 70% w/w, particularly about 40% w/w to about 70% w/w. Less concentrated solutions may result in lower yields of the phosphor.

Any numerical values recited herein include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

The amount of manganese in the resulting $Mn^{4+}$ doped phosphor ranges from about 0.3 weight % (wt %) to about 2.5 wt %, (from about 1.2 mole % (mol %) to about 10 mol %), based on total weight of the precursor or phosphor. In some embodiments, the amount of manganese ranges from about 0.3 wt % to about 1.5 wt % (from about 1.2 mol % to about 6 mol %), particularly from about 0.50 wt % to about 0.85 wt % (from about 2 mol % to about 3.4 mol %), and more particularly from about 0.65 wt % to about 0.75 wt % (from about 2.6 mol % to about 3 mol %). In other embodiments, the amount of manganese ranges from about 0.75 wt %-2.5 wt % (about 3 mol % to about 10 mol %), particularly from about 0.9 wt % to 1.5 wt % (from about 3.5 mol % to about 6 mol %), more particularly from about 0.9 wt % to about 1.4 wt % (about 3.0 mol % to about 5.5 mol %), and even more particularly from about 0.9 wt % to about 1.3 wt % (about 3.5 mol % to about 5.1 mol %).

The resulting phosphor may have a particle size distribution with a D50 value of less than about 30 microns. In particular embodiments, the D50 particle size ranges from about 10 microns to about 20 microns. In some embodiments, the population of phosphor particles have a particle size span ≤1. In particular embodiments, the particle size span ≤0.9.

Particle size span=$(D90-D10)/D50$

For example, as shown in Table 1 below, the particle size span for examples 3 and 4 is ≤1, and for example 5 is ≤0.9.

A lighting apparatus or light emitting assembly or lamp 10 according to one embodiment of the present invention is shown in FIG. 1. Lighting apparatus 10 includes a semiconductor radiation source, shown as light emitting diode (LED) chip 12, and leads 14 electrically attached to the LED chip. The leads 14 may be thin wires supported by a thicker lead frame(s) 16 or the leads may be self-supported electrodes and the lead frame may be omitted. The leads 14 provide current to LED chip 12 and thus cause it to emit radiation.

The lamp may include any semiconductor blue or UV light source that is capable of producing white light when its emitted radiation is directed onto the phosphor. In one embodiment, the semiconductor light source is a blue emitting LED doped with various impurities. Thus, the LED may comprise a semiconductor diode based on any suitable III-V, II-VI or IV-IV semiconductor layers and having an emission wavelength of about 250 to 550 nm. In particular, the LED may contain at least one semiconductor layer comprising GaN, ZnSe or SiC. For example, the LED may comprise a nitride compound semiconductor represented by the formula $In_iGa_jAl_kN$ (where $0 \leq i$; $0 \leq j$; $0 \leq k$ and $1+j+k=1$) having an emission wavelength greater than about 250 nm and less than about 550 nm. In particular embodiments, the chip is a near-uv or blue emitting LED having a peak emission wavelength from about 400 to about 500 nm. Such LED semiconductors are known in the art. The radiation source is described herein as an LED for convenience. However, as used herein, the term is meant to encompass all semiconductor radiation sources including, e.g., semiconductor laser diodes. Further, although the general discussion of the exemplary structures of the invention discussed herein is directed toward inorganic LED based light sources, it should be understood that the LED chip may be replaced by another radiation source unless otherwise noted and that any reference to semiconductor, semiconductor LED, or LED chip is merely representative of any appropriate radiation source, including, but not limited to, organic light emitting diodes.

In lighting apparatus 10, a phosphor composition 22 is radiationally coupled to the LED chip 12. The phosphor composition includes the manganese ($Mn^{4+}$) doped phosphor as described in above embodiments. Radiationally coupled means that the elements are associated with each other so radiation from one is transmitted to the other. The phosphor composition 22 is deposited on the LED 12 by any appropriate method. For example, a water based suspension of the phosphor(s) can be formed, and applied as a phosphor layer to the LED surface. In one such method, a silicone slurry in which the phosphor particles are randomly suspended is placed around the LED. This method is merely exemplary of possible positions of phosphor composition 22 and LED 12. Thus, phosphor composition 22 may be coated over or directly on the light emitting surface of the LED chip 12 by coating and drying the phosphor suspension over the LED chip 12. In the case of a silicone-based suspension, the suspension is cured at an appropriate temperature. Both the shell 18 and the encapsulant 20 should be transparent to allow white light 24 to be transmitted through those elements. Although not intended to be limiting, in some embodiments, the D50 particle size of the phosphor composition ranges from about 1 to about 50 microns, particularly from about 10 to about 35 microns.

In other embodiments, phosphor composition 22 is interspersed within the encapsulant material 20, instead of being formed directly on the LED chip 12. The phosphor (in the form of a powder) may be interspersed within a single region of the encapsulant material 20 or throughout the entire volume of the encapsulant material. Blue light emitted by the LED chip 12 mixes with the light emitted by phosphor composition 22, and the mixed light appears as white light. If the phosphor is to be interspersed within the material of encapsulant 20, then a phosphor powder may be added to a polymer or silicone precursor, and then the mixture may be cured to solidify the polymer or silicone material after or before loading the mixture on the LED chip 12. Examples of polymer precursors include thermoplastic or thermoset polymers or a resin, for example epoxy resin. Other known phosphor interspersion methods may also be used, such as transfer loading.

In some embodiments, the encapsulant material 20 have an index of refraction R, and, in addition to phosphor composition 22, contains a diluent material having less than about 5% absorbance and index of refraction of R±0.1. The diluent material has an index of refraction of particularly and more particularly ≤1.5. In particular embodiments, the diluent material is of formula (II): $A_x[MF_y]$, and has an index of refraction of about 1.4. Adding an optically inactive material to the phosphor/silicone mixture may produce a more gradual distribution of light flux through the phosphor/encapsulant mixture and can result in less damage to the phosphor. Suitable materials for the diluent include fluoride compounds such as LiF, $MgF_2$, $CaF_2$, $SrF_2$, $AlF_3$, $K_2NaAlF_6$, $KMgF_3$, $CaLiAlF_6$, $K_2LiAlF_6$, and $K_2SiF_6$, which have index of refraction ranging from about 1.38 ($AlF_3$ and $K_2NaAlF_6$) to about 1.43 ($CaF_2$), and polymers having index of refraction ranging from about 1.254 to about 1.7. Non-limiting examples of polymers suitable for use as a diluent include polycarbonates, polyesters, nylons, polyetherimides, polyetherketones, and polymers derived from styrene, acrylate, methacrylate, vinyl, vinyl acetate, ethylene, propylene oxide, and ethylene oxide monomers, and copolymers thereof, including halogenated and unhalogenated derivatives. These polymer powders can be directly incorporated into silicone encapsulants before silicone curing.

In yet another embodiment, phosphor composition 22 is coated onto a surface of the shell 18, instead of being formed over the LED chip 12. The phosphor composition is preferably coated on the inside surface of the shell 18, although the phosphor may be coated on the outside surface of the shell, if desired. Phosphor composition 22 may be coated on the entire surface of the shell or only a top portion of the surface of the shell. The UV/blue light emitted by the LED chip 12 mixes with the light emitted by phosphor composition 22, and the mixed light appears as white light. Of course, the phosphor may be located in any two or all three locations or in any other suitable location, such as separately from the shell or integrated into the LED.

Figure 2:
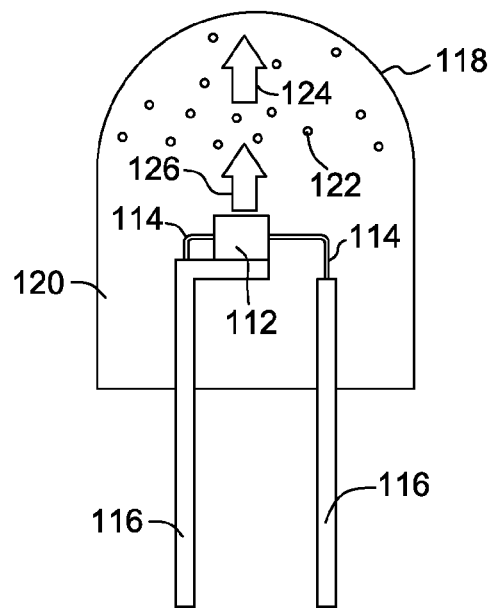
FIG. 2 is a schematic cross-sectional view of a lighting apparatus in accordance with another embodiment of the invention.

FIG. 2 illustrates a second structure of the system according to the present invention. Corresponding numbers from FIGS. 1-4 (e.g. 12 in FIGS. 1 and 112 in FIG. 2) relate to corresponding structures in each of the figures, unless otherwise stated. The structure of the embodiment of FIG. 2 is similar to that of FIG. 1, except that the phosphor composition 122 is interspersed within the encapsulant material 120, instead of being formed directly on the LED chip 112. The phosphor (in the form of a powder) may be interspersed within a single region of the encapsulant material or throughout the entire volume of the encapsulant material. Radiation (indicated by arrow 126) emitted by the LED chip 112 mixes with the light emitted by the phosphor 122, and the mixed light appears as white light 124. If the phosphor is to be interspersed within the encapsulant material 120, then a phosphor powder may be added to a polymer precursor, and loaded around the LED chip 112. The polymer or silicone precursor may then be cured to solidify the polymer or silicone. Other known phosphor interspersion methods may also be used, such as transfer molding.

Figure 3:
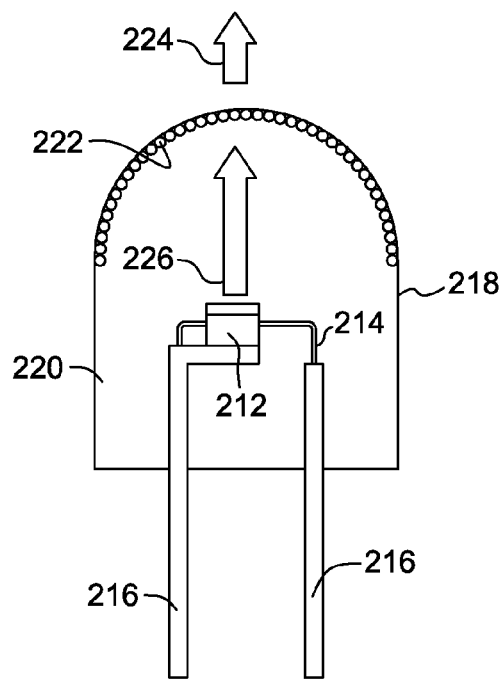
FIG. 3 is a schematic cross-sectional view of a lighting apparatus in accordance with yet another embodiment of the invention.

FIG. 3 illustrates a third possible structure of the system according to the present invention. The structure of the embodiment shown in FIG. 3 is similar to that of FIG. 1, except that the phosphor composition 222 is coated onto a surface of the envelope 218, instead of being formed over the LED chip 212. The phosphor composition 222 is preferably coated on the inside surface of the envelope 218, although the phosphor may be coated on the outside surface of the envelope, if desired. The phosphor composition 222 may be coated on the entire surface of the envelope, or only a top portion of the surface of the envelope. The radiation 226 emitted by the LED chip 212 mixes with the light emitted by the phosphor composition 222, and the mixed light appears as white light 224. Of course, the structures of FIGS. 1-3 may be combined, and the phosphor may be located in any two or all three locations, or in any other suitable location, such as separately from the envelope, or integrated into the LED.

In any of the above structures, the lamp may also include a plurality of scattering particles (not shown), which are embedded in the encapsulant material. The scattering particles may comprise, for example, alumina or titania. The scattering particles effectively scatter the directional light emitted from the LED chip, preferably with a negligible amount of absorption.

Figure 4:
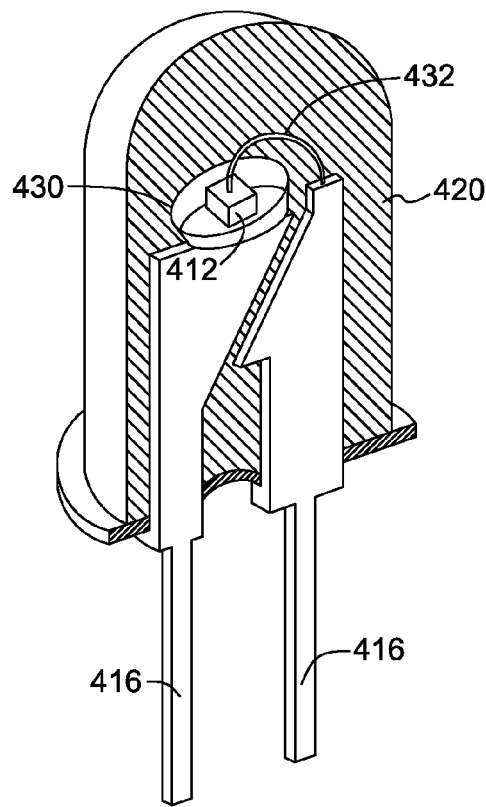
FIG. 4 is a cutaway side perspective view of a lighting apparatus in accordance with one embodiment of the invention.

As shown in a fourth structure in FIG. 4, the LED chip 412 may be mounted in a reflective cup 430. The cup 430 may be made from or coated with a dielectric material, such as alumina, titania, or other dielectric powders known in the art, or be coated by a reflective metal, such as aluminum or silver. The remainder of the structure of the embodiment of FIG. 4 is the same as those of any of the previous figures, and can include two leads 416, a conducting wire 432, and an encapsulant material 420. The reflective cup 430 is supported by the first lead 416 and the conducting wire 432 is used to electrically connect the LED chip 412 with the second lead 416.

Figure 5:
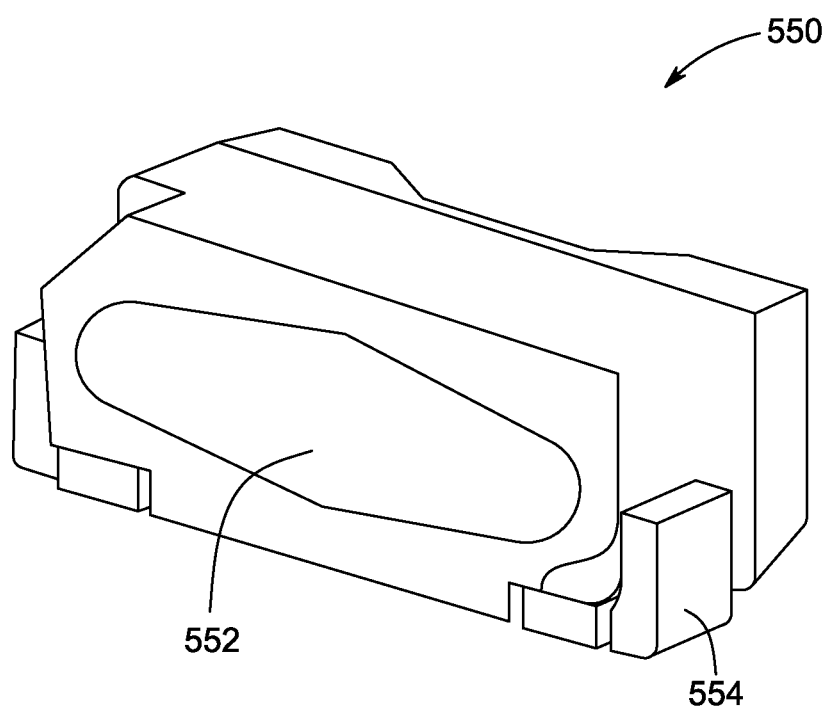
FIG. 5 is a schematic perspective view of a surface-mounted device (SMD) backlight LED.

Another structure (particularly for backlight applications) is a surface mounted device ("SMD") type light emitting diode 550, e.g. as illustrated in FIG. 5. This SMD is a "side-emitting type" and has a light-emitting window 552 on a protruding portion of a light guiding member 554. An SMD package may comprise an LED chip as defined above, and a phosphor material that is excited by the light emitted from the LED chip. Other backlight devices include, but are not limited to, TVs, computers, monitors, smartphones, tablet computers and other handheld devices that have a display including a semiconductor light source; and a $Mn^{4+}$ doped phosphor according to the present invention.

When used with an LED emitting at from 350 to 550 nm and one or more other appropriate phosphors, the resulting lighting system will produce a light having a white color. Lamp 10 may also include scattering particles (not shown), which are embedded in the encapsulant material. The scattering particles may comprise, for example, alumina or titania. The scattering particles effectively scatter the directional light emitted from the LED chip, preferably with a negligible amount of absorption.

In addition to the $Mn^{4+}$ doped phosphor, phosphor composition 22 may include one or more other phosphors. When used in a lighting apparatus in combination with a blue or near UV LED emitting radiation in the range of about 250 to 550 nm, the resultant light emitted by the assembly will be a white light. Other phosphors such as green, blue, yellow, red, orange, or other color phosphors may be used in the blend to customize the white color of the resulting light and produce specific spectral power distributions. Other materials suitable for use in phosphor composition 22 include electroluminescent polymers such as polyfluorenes, preferably poly(9,9-dioctyl fluorene) and copolymers thereof, such as poly(9,9'-dioctylfluorene-co-bis-N,N'-(4-butylphenyl)diphenylamine) (F8-TFB); poly(vinylcarbazole) and polyphenylenevinylene and their derivatives. In addition, the light emitting layer may include a blue, yellow, orange, green or red phosphorescent dye or metal complex, or a combination thereof. Materials suitable for use as the phosphorescent dye include, but are not limited to, tris(1-phenylisoquinoline) iridium (III) (red dye), tris(2-phenylpyridine) iridium (green dye) and Iridium (III) bis(2-(4, 6-difluorephenyl)pyridinato-N,C2) (blue dye). Commercially available fluorescent and phosphorescent metal complexes from ADS (American Dyes Source, Inc.) may also be used. ADS green dyes include ADS060GE, ADS061GE, ADS063GE, and ADS066GE, ADS078GE, and ADS090GE. ADS blue dyes include ADS064BE, ADS065BE, and ADS070BE. ADS red dyes include ADS067RE, ADS068RE, ADS069RE, ADS075RE, ADS076RE, ADS067RE, and ADS077RE.

Suitable phosphors for use in phosphor composition 22 include, but are not limited to:
$((Sr_{1-z}$ (Ca, Ba, Mg, Zn)$_z)_{1-(x+w)}$(Li, Na, K, Rb)$_w$Ce$_x$)$_3$ $(Al_{1-y}Si_y)O_{4+y+3(x-w)}F_{1-y-3(x-w)}$, $0 < x \leq 0.10$, $0 \leq y \leq 0.5$, $0 \leq z \leq 0.5$, $0 \leq w \leq x$; $(Ca,Ce)_3Sc_2Si_3O_{12}$(CaSiG); $(Sr,Ca,Ba)_3Al_{1-x}Si_xO_{4+x}F_{1-x}:Ce^{3+}$ (SASOF)); $(Ba,Sr,Ca)_5(PO_4)_3(Cl,F,Br,OH):Eu^{2+},Mn^{2+}$; $(Ba,Sr,Ca)BPO_5:Eu^{2+}$, $Mn^{2+}$; $(Sr,Ca)_{10}(PO_4)_6 \ast vB_2O_3:Eu^{2+}$ (wherein $0 < v \leq 1$); $Sr_2Si_3O_8 \ast 2SrCl_2:Eu^{2+}$; $(Ca,Sr,Ba)_3MgSi_2O_8:Eu^{2+},Mn^{2+}$; $BaAl_8O_{13}:Eu^{2+}$; $2SrO \ast 0.84P_2O_5 \ast 0.16B_2O_3:Eu^{2+}$; $(Ba,Sr,Ca)MgAl_{10}O_{17}:Eu^{2+},Mn^{2+}$; $(Ba,Sr,Ca)Al_2O_4:Eu^{2+}$; $(Y,Gd,Lu,Sc,La)BO_3:Ce^{3+},Tb^{3+}$; $ZnS:Cu^+,Cl^-$; $ZnS:Cu^+,Al^{3+}$; $ZnS:Ag^+,Cl^-$; $ZnS:Ag^+,Al^{3+}$; $(Ba,Sr,Ca)_2Si_{1-\xi}O_{4-2\xi}:Eu^{2+}$ (wherein $-0.2 \leq \xi \leq 0.2$); $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_{5-\alpha}O_{12-3/2\alpha}:Ce^{3+}$ (wherein $0 \leq \alpha \leq 0.5$); $(Ca,Sr)_8(Mg,Zn)(SiO_4)_4Cl_2:Eu^{2+},Mn^{2+}$; $Na_2Gd_2B_2O_7:Ce^{3+},Tb^{3+}$; $(Sr,Ca,Ba,Mg,Zn)_2P_2O_7:Eu^{2+},Mn^{2+}$; $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)VO_4:Eu^{3+},Bi^{3+}$; $(Ca,Sr)S:Eu^{2+},Ce^{3+}$; $SrY_2S_4:Eu^{2+}$; $CaLa_2S_4:Ce^{3+}$; $(Ba,Sr,Ca)MgP_2O_7:Eu^{2+},Mn^{2+}$; $(Y,Lu)_2WO_6:Eu^{3+},Mo^{6+}$; $(Ba,Sr,Ca)_\beta Si_\gamma N_\mu:Eu^{2+}$ (wherein $2\beta+4\gamma=3\mu$); $(Ba,Sr,Ca)_2Si_{5-x}Al_xN_{8-x}O_x:Eu^{2+}$ (wherein $0 \leq x \leq 2$); $Ca_3(SiO_4)Cl_2:Eu^{2+}$; $(Lu,Sc,Y,Tb)_{2-u-v}Ce_vCa_{1+u}Li_wMg_{2-w}P_w(Si,Ge)_{3-w}O_{12-u/2}$ (where $0.5 \leq u \leq 1$, $0 < v \leq 0.1$, and $0 \leq w \leq 0.2$); $(Y,Lu,Gd)_{2-\phi}Ca_\phi Si_4N_{6+\phi}C_{1-\phi}:Ce^{3+}$, (wherein $0 \leq \phi \leq 0.5$); (Lu,Ca,Li,Mg,Y), $\alpha$-SiAlON doped with $Eu^{2+}$ and/or $Ce^{3+}$; $(Ca,Sr,Ba)SiO_2N_2:Eu^{2+},Ce^{3+}$; $\beta$-SiAlON:$Eu^{2+}$, $3.5MgO \ast 0.5MgF_2 \ast GeO_2:Mn^{4+}$; $(Sr,Ca,Ba)AlSiN_3:Eu^{2+}$; $(Sr,Ca,Ba)_3SiO_5:Eu^{2+}$; $Ca_{1-c-f}Ce_cEu_fAl_{1+c}Si_{1-c}N_3$, (where $0 \leq c \leq 0.2$, $0 \leq f \leq 0.2$); $Ca_{1-h-r}Ce_hEu_rAl_{1-h}(Mg,Zn)_hSiN_3$, (where $0 \leq h \leq 0.2$, $0 \leq r \leq 0.2$); $Ca_{1-2s-t}Ce_s(Li,Na)_sEu_tAlSiN_3$, (where $0 \leq s \leq 0.2$, $0 \leq f \leq 0.2$, $s+t>0$); and $Ca_{1-\sigma-\chi-\phi}Ce_\sigma.(Li,Na)_\chi.Eu_\phi.Al_{1+\sigma-\chi}Si_{1-\sigma+\chi}N_3$, (where $0 \leq \sigma \leq 0.2$, $0 \leq \chi \leq 0.4$, $0 \leq \phi \leq 0.2$).

The ratio of each of the individual phosphors in the phosphor blend may vary depending on the characteristics of the desired light output. The relative proportions of individual phosphors in the various embodiment phosphor blends may be adjusted such that when their emissions are blended and employed in an LED lighting device, there is produced visible light of predetermined x and y values on the CIE chromaticity diagram. As stated, a white light is preferably produced. This white light may, for instance, may possess an x value in the range of about 0.20 to about 0.55, and a y value in the range of about 0.20 to about 0.55. As stated, however, the exact identity and amounts of each phosphor in the phosphor composition can be varied according to the needs of the end user. For example, the material can be used for LEDs intended for liquid crystal display (LCD) backlighting. In this application, the LED color point would be appropriately tuned based upon the desired white, red, green, and blue colors after passing through an LCD/color filter combination. The list of potential phosphor for blending given here is not meant to be exhaustive and these $Mn^{4+}$-doped phosphors can be blended with various phosphors with different emission to achieve desired spectral power distributions.

The $Mn^{4+}$ doped phosphors of the present invention may be used in applications other than those described above. For example, the material may be used as a phosphor in a fluorescent lamp, in a cathode ray tube, in a plasma display device or in a liquid crystal display (LCD). The material may also be used as a scintillator in an electromagnetic calorimeter, in a gamma ray camera, in a computed tomography scanner or in a laser. These uses are merely exemplary and not limiting.

EXAMPLES

The examples that follow are merely illustrative, and should not be construed to be any sort of limitation on the scope of the claimed invention.

Preparation of $K_2SiF_6$

Example 1

$K_2SiF_6$ (100 g) (Aldrich) was ball milled for 1 hour followed by sieving through a 44 microns screen to remove coarse particles. The D50 particle size of the resulting particles was 19 microns.

Example 2

KF (13 g) was added to 80 milliliters (ml) of 48% HF. $H_2SiF_6$ (35%) (30 ml) was added to 30 ml of 48% HF. Both solutions were individually stirred, and then the $H_2SiF_6$/HF solution was added to the KF/HF solution. The resulting $K_2SiF_6$ particles had a D50 particle size of 15 microns.

Synthesis of Manganese ($Mn^{4+}$) Doped $K_2SiF_6$ (PFS Phosphor)

Example 3

$K_2SiF_6$ (16 g) particles as prepared in example 1 were added to a beaker containing 130 milliliters (ml) of 48% HF. The suspension was stirred for 10 minutes. $KHF_2$ (8 g) was added to a beaker containing 20 ml of 48% HF while being stirred. K$_2$MnF$_6$ (2 g) was added to a beaker containing 30 mL of 48% HF and the solution was stirred for 5 minutes. To the stirred K$_2$SiF$_6$ suspension, the K$_2$MnF$_6$ solution was added dropwise at 4 ml/min. The KHF$_2$ solution was added to this same beaker at a rate of 3 ml/min after the K$_2$MnF$_6$ solution was dripping for 3 minutes. Upon completion of the addition of KHF$_2$, the suspension was stirred for an additional 10 minutes. After stirring was stopped, the supernatant was decanted, the resulting phosphor material was vacuum filtered, rinsed once with acetic acid and twice with acetone and then dried overnight under vacuum.

Example 4

K$_2$SiF$_6$ (8 g) particles as prepared in example 1 were added to a beaker containing 130 ml of 48% HF. The suspension was stirred for 10 minutes. KF (4.5 g) was added to a beaker containing 20 ml of 48% HF while being stirred. This process is highly exothermic, and thus the solution of KF was allowed to cool for several minutes. K$_2$MnF$_6$ (1.5 g) was added to a beaker containing 30 ml of 48% HF and the solution was stirred for 5 minutes. To the stirred suspension of K$_2$SiF$_6$ particles, the K$_2$MnF$_6$ solution was added dropwise at 4 ml/min. The KF solution was added to this same beaker at a rate of 3 ml/min after the K$_2$MnF$_6$ solution was dripping for 3 minutes. Upon completion of the addition of KF, the suspension was stirred for an additional 5 minutes. After stirring was stopped, the supernatant was decanted, the resulting phosphor material was vacuum filtered, rinsed once with acetic acid and twice with acetone and then dried overnight under vacuum.

Example 5

K$_2$SiF$_6$ (12 g) particles as prepared in example I were added to a beaker containing 130 ml of 48% HF. The suspension was stirred for 10 minutes. KF (8 g) was added to a second beaker containing 20 ml of 48% HF while being stirred. This process is highly exothermic, and thus the solution of KF was allowed to cool for several minutes. K$_2$MnF$_6$ (2 g) was added to a third beaker containing 30 ml of 48% HF and the solution was stirred for 5 minutes. To a fourth beaker, 4 ml of 35% H$_2$SiF$_6$ was added to 12 mL of 48% HF and stirred. To the stirring solution of K$_2$SiF$_6$ particles, the K$_2$MnF$_6$ solution was added dropwise at 4 ml/min. The KF solution was added to this same beaker at a rate of 3 ml/min after the K$_2$MnF$_6$ solution was dripping for 3 minutes. The H$_2$SiF$_6$ solution was added dropwise at a rate of 3 ml/min after the K$_2$MnF$_6$ solution was dripping for 4 minutes. Upon completion of the addition of H$_2$SiF$_6$, the suspension was stirred for an additional 5 minutes. After stirring was stopped, the supernatant was decanted, the resulting phosphor material was vacuum filtered, rinsed once with acetic acid and twice with acetone and then dried overnight under vacuum.

Emission spectra of the phosphor materials of example 3, example 4 and example 5 were individually obtained, and it was observed that the emission spectra of the 3 samples match the emission spectrum of K$_2$SiF$_6$:Me$^{4+}$. Table 1 shows spectral characteristics of the 3 samples.

TABLE 1

| Sample | Particle size D10/D50/D90 (μm) | Particle size span | QE (%) | Mn concentration (wt %) | Blue Bleedthrough | Reflected radiation (450 nm) |
| --- | --- | --- | --- | --- | --- | --- |
| Example 3 | 9/14/22 | 0.928 | 100 | — | 40.6% | 23% |
| Example 4 | 10/17/27 | 1.0 | 106 | 0.71 | 65.9% | 23% |
| Example 5 | 10/17/25 | 0.882 | 114 | 1.13 | 32.1% | 20% |

Example 6

K$_2$SiF$_6$ (8 g) particles were added to a beaker containing 160 ml of 48% HF. The mixture was stirred for 30 minutes, and then vacuum filtered to remove any undissolved K$_2$SiF$_6$. A solution 1 was prepared by adding 30 ml of 35% H$_2$SiF$_6$ to 120 ml of 48% HF. A solution 2 was prepared by adding 5.47 g KF to 12 ml of HF. A solution 3 was prepared by adding 1.5 g K$_2$MnF$_6$ to 30 ml HF. The three solutions, solution 1, solution 2 and solution 3 were added to the filtrate drop wise. Initially, the addition of the solution 3 was delayed with respect to the solution 1 and solution 2. A low Mn$^{4+}$ concentration of core and Mn$^{4+}$-rich shell was obtained. In some examples, by extending the addition duration of the solution 1 and/or solution 2 relative to the solution 3, an additional shell of low Mn$^{4+}$ concentration was resulted.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A population of particles having a core which is substantially free of Mn$^{4+}$ ions, a first shell and a second shell, wherein the core comprises a compound of formula (II)

$$A_x[MF_y]  \qquad (II);$$

the first shell comprises a composition of formula (IV)

$$A_x[(M_{1-z},Mn_z)F_y]  \qquad (IV)$$

and the second shell comprises a composition of formula (V)

$$A_x[(M_{1-w},Mn_w)F_y]  \qquad (V)$$

wherein

A is Li, Na, K, Rb, Cs, or a combination thereof;

M is Si, Ge, Sn, Ti, Zr, Al, Ga, In, Sc, Hf, Y, La, Nb, Ta, Bi, Gd, or a combination thereof;

x is 1, 2 or 3 and is equal to the absolute value of the charge of the [MF$_y$] ion;

y is 5, 6 or 7; and $0 < z \leq 0.2$; and $0 \leq w \leq z$.

2. The population of particles according to claim 1, comprising a particle size distribution having a particle size span ≤1.

3. The population of particles according to claim 1, comprising a particle size distribution having a particle size span ≤0.9.

4. The population of particles according to claim 1, wherein the core is $K_2SiF_6$ and first shell is $K_2(Si_{1-z}, Mn_z)F_6$.

5. The population of particles according to claim 1, wherein the second shell is $K_2(Si_{1-w}, Mn_w)F_6$.

6. A lighting apparatus comprising a semiconductor light source and the population of particles according to claim 1 radiationally coupled to the light source.

7. A backlight device comprising a semiconductor light source and the population of particles according to claim 1 radiationally coupled to the light source.

\* \* \* \* \*